(12) United States Patent
Oggioni et al.

(10) Patent No.: US 6,717,255 B2
(45) Date of Patent: Apr. 6, 2004

(54) CHIP CARRIER FOR A HIGH-FREQUENCY ELECTRONIC PACKAGE

(75) Inventors: Stefano Oggioni, Milan (IT); Roberto Ravanelli, Milan (IT)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/032,675

(22) Filed: Oct. 23, 2001

(65) Prior Publication Data

US 2002/0055277 A1 May 9, 2002

(30) Foreign Application Priority Data

Oct. 24, 2000 (GB) .............................. 0025985

(51) Int. Cl.[7] ............................. H01L 23/48
(52) U.S. Cl. ................ 257/690; 257/691; 257/700; 257/758; 257/737; 174/52.1; 174/261
(58) Field of Search ............... 257/690, 691, 257/700, 758, 762, 774, 706, 707, 712, 713, 784; 361/728, 730, 748, 749, 750, 751, 764; 174/52.1, 260, 261

(56) References Cited

U.S. PATENT DOCUMENTS

| | | | | |
|---|---|---|---|---|
| 4,866,507 A | | 9/1989 | Jacobs et al. ............... 375/74 |
| 4,967,201 A | | 10/1990 | Rich, III ..................... 342/175 |
| 5,719,749 A | * | 2/1998 | Stopperan ................... 361/769 |
| 5,949,654 A | * | 9/1999 | Fukuoka ..................... 361/761 |
| 6,365,975 B1 | * | 4/2002 | DiStefano et al. ............ 25/777 |
| 6,373,717 B1 | * | 4/2002 | Downes, Jr. et al. ........ 361/795 |
| 6,388,890 B1 | * | 5/2002 | Kwong et al. .............. 361/780 |
| 6,392,301 B1 | * | 5/2002 | Waizman et al. ........... 257/774 |
| 6,452,250 B1 | * | 9/2002 | Buynoski ..................... 257/532 |
| 6,452,264 B2 | * | 9/2002 | Nishide et al. ............. 257/703 |

FOREIGN PATENT DOCUMENTS

EP      0083265 A1    7/1983

* cited by examiner

Primary Examiner—Kamand Cuneo
Assistant Examiner—Lourdes Cruz
(74) Attorney, Agent, or Firm—William N. Hogg

(57) ABSTRACT

An electronic package is provided. The electronic package includes a chip carrier having a first conductive layer which includes at least one signal track and at least one contact area, the contact area being electrically connected to the signal track and adapted for transmitting a high-frequency signal. The chip carrier further includes a reference structure having at least two conductive layers such that the signal track is electrically shielded by the reference structure. A semiconductor chip is positioned on the chip carrier and includes at least one terminal electrically interconnected to the at least one contact area.

20 Claims, 4 Drawing Sheets

CHIP CARRIER FOR A HIGH-FREQUENCY ELECTRONIC PACKAGE

FIELD OF THE INVENTION

The present invention relates to a chip carrier and an electronic package for a high-frequency electronic device.

BACKGROUND OF THE INVENTION

Several types of electronic devices utilizing a circuit, which is integrated in a chip of semiconductor material, are possible. The chip is typically mounted on a chip carrier, so as to protect the chip from mechanical stresses, and is then encapsulated to produce an electronic package. The chip carrier includes an insulating substrate with conductive tracks, each track bonded to a corresponding terminal of the chip. Each track terminates at a contact pad (typically for connection to a printed circuit board).

The transmission of a signal in a corresponding conductive track generates an electromagnetic wave; the wave propagates along a transmission line defined by the conductive track and an underlying ground plane (which is connected to a reference voltage for shielding the conductive track from electromagnetic interference). When the chip operates at a high frequency (for example more than about 1 Gigahertz), the propagation of the wave (microwave) can severely affect the performance of the electronic package.

Particularly, any discontinuity (or transition) in the transmission line that the signal encounters as it travels along a conductive track, such as any change in structure, material properties and/or design features, generates a reflected wave. Moreover, the package includes stray structures (capacitors, inductors and resistors), which act as low pass filters for the transmitted signal. As a consequence, the integrity of the electromagnetic wave propagated along the transmission line degrades, especially at high frequencies.

The transmitted signal, switching between a low voltage (logic value 0) and a high voltage (logic value 1) generates a square-shaped wave. Because of discontinuities in the transmission line, this wave is generally received as a pseudo-sinusoidal wave. The quality of the transmitted wave can be visualized by a so-called "eye diagram", which plots the value of the received signal as a function of the phase of a clock signal controlling the electronic package. The above described discontinuities in the transmission line reduce the central opening of the eye diagram. Therefore, it is quite difficult to understand if a switching transition has actually taken place or if the shift of a signal baseline is due to background noise.

These drawbacks are particular acute in modern electronic devices working with a reduced level of power supply voltage (down to 1.2 V). In this case, there is a very low margin to discriminate between the logic value 0 (1V) and the logic value 1 (1.2V).

Moreover, the continuous trend towards miniaturization of electronic devices requires a reduction in the dimensions of chip carrier conductive tracks on which such devices are packaged. However, the impedance of the transmission line must be maintained at a desired value which optimizes the performance of the electronic device (typically 50 W). Therefore, it is necessary to use a thin dielectric layer between the conductive tracks and the ground plane of the electronic package (since the impedance is inversely proportional to the track width and directly proportional to the dielectric layer thickness). A shortened distance between conductive tracks and the ground plane increases the value of a corresponding stray capacitance. As a consequence, the bandwidth of the transmission line is strongly reduced.

Therefore, as the quality of the transmission in the package is degraded it can cause the electronic device to operate at a frequency far lower than the working frequency which is afforded by the chip.

SUMMARY OF THE INVENTION

It is an object of the present invention to overcome the above mentioned drawbacks.

According to one aspect of the invention, there is provided a chip carrier comprising a first conductive layer having at least one signal track and at least one contact area, the contact area being electrically connected to the signal track and adapted for transmitting a high-frequency signal, and a reference structure including a first conductive reference track insulated and spaced from the first conductive layer, the first conductive reference track having a first portion and a second portion spacedly positioned from the first portion, and a second conductive reference track insulated from the first conductive layer and the first conductive reference track, a portion of the second conductive reference track spaced between the first conductive layer and the first conductive reference track, the signal track substantially overlying the portion of the second conductive reference track, and the contact area substantially overlying the first portion of the first conductive reference track, the signal track being electrically shielded by the reference structure.

According to another aspect of the invention, there is provided an electronic package comprising a chip carrier including a first conductive layer having at least one signal track and at least one contact area, the contact area being electrically connected to the signal track and adapted for transmitting a high-frequency signal, the chip carrier further including a reference structure including a first conductive reference track insulated and spaced from the first conductive layer, the first conductive reference track having a first portion and a second portion spacedly positioned from the first portion, and a second conductive reference track insulated from the first conductive layer and the first conductive reference track, a portion of the second conductive reference track spaced between the first conductive layer and the first conductive reference track, the signal track substantially overlying the portion of the second conductive reference track, and the contact area substantially overlying the first portion of the first conductive reference track, the signal track being electrically shielded by the reference structure, and a semiconductor chip positioned on the chip carrier and having at least one terminal electrically interconnected to the at least one contact area.

The above objects, advantages, and features of the present invention will become more readily apparent from the following detailed description of the presently preferred embodiments as illustrated in the accompanying drawings.

BRIEF DESCRIPTION OF THE DRAWINGS

FIG. 2b is a partial sectional view, in elevation as taken along line A—A in FIG. 2a;

DESCRIPTION OF THE PREFERRED EMBODIMENTS

Figure 1:
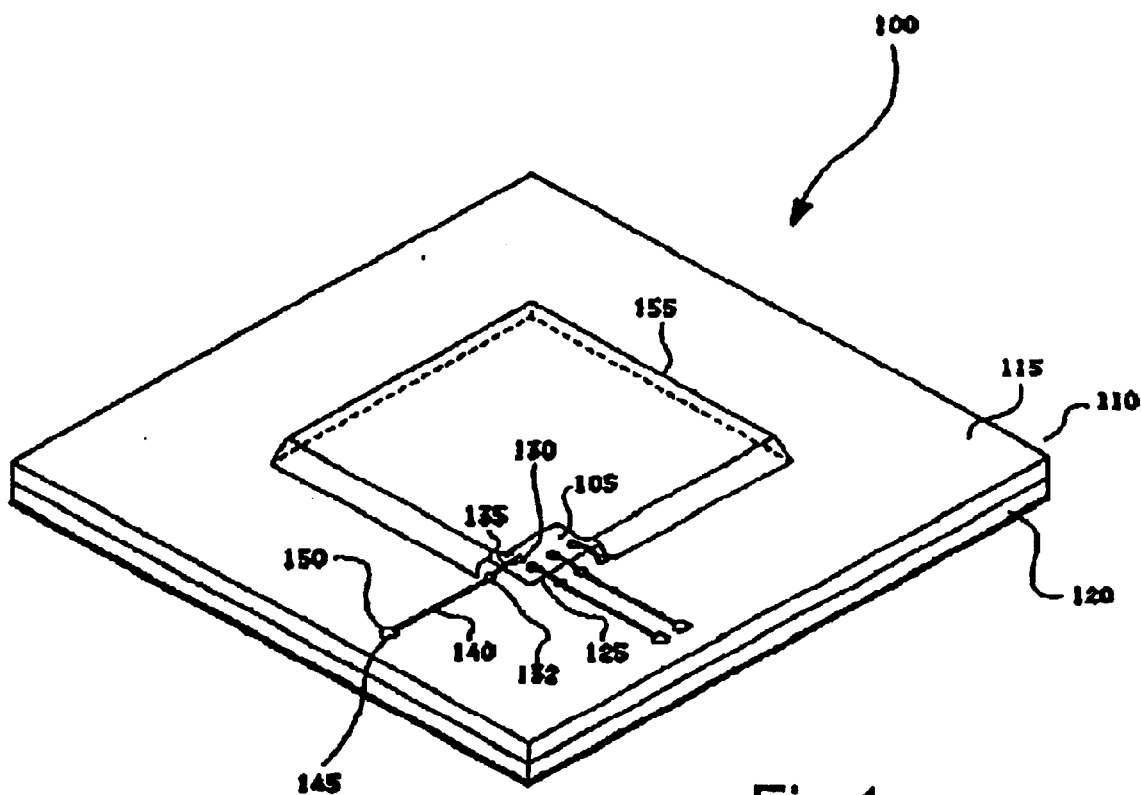
FIG. 1 is an enlarged isometric view of one embodiment of the present invention illustrating the electronic package having a portion of a molded cap cut away to expose a portion of a semiconductor chip and a chip carrier.

With reference to FIG. 1, there is depicted an electronic package 100 of the BGA (Ball Grid Array) type. The electronic package 100 includes a chip 105 of semiconductor material, wherein a power circuit working at a high frequency (for example with a clock rate of about 5 Gigahertz) is integrated. The chip 105 can be supplied by a low voltage power supply (for example of 1.2V).

The chip 105 is mounted on a chip carrier 110, having an insulating circuitized substrate 115 provided on a stiffener 120. The substrate 115 comprises a multilayer structure, with several conductive layers (made for example of copper) insulated from each other (for example by means of an epoxy resin with glass fibers). The stiffener 120 consists of a metallic plate (made for example of copper) which can also act as a heat-sink for dissipating heat produced by chip 105. A cavity 125, exposing a central region of stiffener 120, is positioned in substrate 115. The chip 105 is positioned in cavity 125 and bonded to stiffener 120 by means of an epoxy glue, which can compensate for the different coefficients of thermal expansion of chip 105 and stiffener 120.

The chip 105 is wire-bonded to chip carrier 110. Particularly, several contact terminals 130 are formed on an upper surface of the chip. Pads 132 are positioned on an upper surface of chip carrier 110. Each terminal 130 is connected to a corresponding pad 132 and conductive track 140 by means of a thin metal wire 135. Thin metal wire 135 can be made of aluminum. Each track 140 terminates at a contact area 145. An interconnecting ball, or bump, 150 (made of a eutectic solder, such as a Tin Lead alloy) is positioned on area 145. The entire chip 105 and a portion of substrate 115 around cavity 125 is then covered with a molded cap 155 (for example of a thermosetting epoxy resin). The molded cap 155 protects chip 105 from the external environment and from mechanical stresses and increases the rigidity of the entire electronic package 100. The electronic package 100 can be turned upside down and mounted on a printed circuit board (not shown), by soldering interconnecting balls 150 onto respective printed circuit board conductive tracks.

Likewise considerations apply if the electronic package is other than a BGA type (for example for a pad-to-pad connection to the printed circuit board), if the chip does not include a (digital) power circuit, if it operates at a different frequency or with a different power supply, and so on.

Figure 2A:
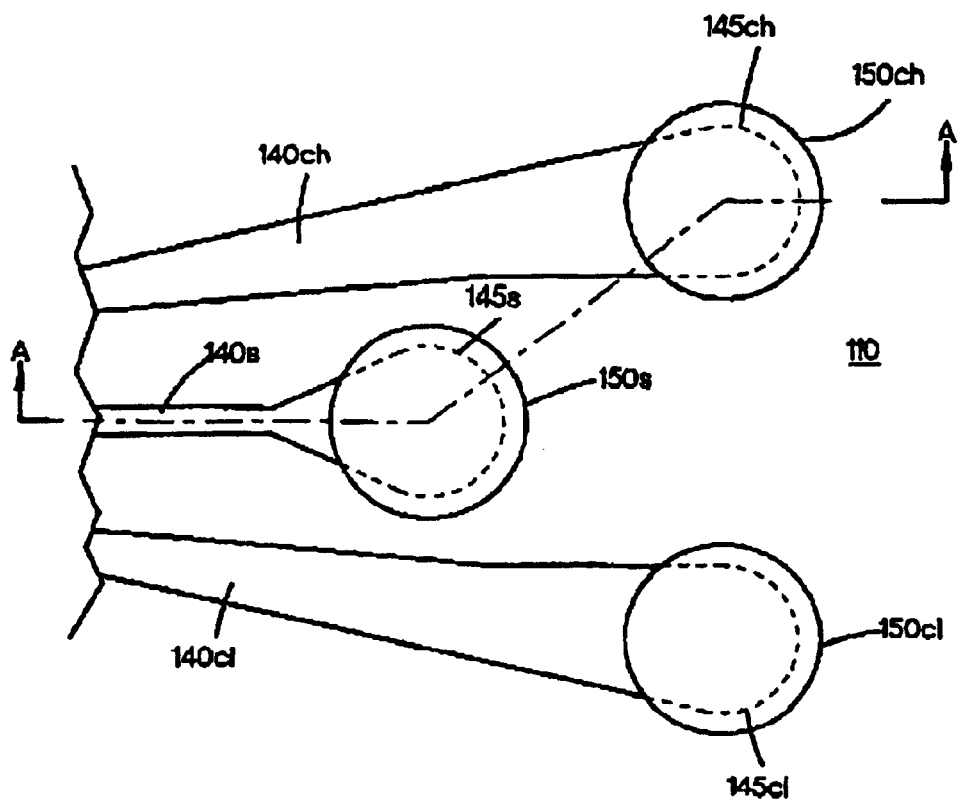
FIG. 2a is an top view of an enlarged portion of the chip carrier of FIG. 1.

Considering now FIG. 2a, there is shown a conductive signal track 140s connected to a contact area 145s (shown as a hidden contact area). An interconnecting ball 150s is positioned on the contact area. A circuit including conductive signal track 140s, contact area 145s and interconnecting ball 150s can be used for transmitting a high-frequency signal from chip 105 to a printed circuit board. A couple of co-planar tracks 140cl and 140ch, respectively, are arranged on either side of conductive signal track 140s. The co-planar tracks 140cl and 140ch terminate at corresponding contact areas 145cl and 145ch (both shown as hidden), respectively. Interconnecting balls 150cl and 150ch are positioned on contact areas 145cl and 145ch, respectively, and can be connected to a reference voltage or ground planes in the printed circuit board to which the interconnecting balls can be assembled.

When a high-frequency signal is transmitted on conductive signal track 140s an electromagnetic wave is generated which propagates along a transmission line defined by conductive signal track 140s, co-planar tracks 140cl and 140ch and an underlying ground structure (not shown in FIG. 2a).

The inventors have discovered that signal degradation and reduced performance of known electronic packages during signal transmission is mainly due to a discontinuity in the transmission line associated with interconnecting ball 150s. Specifically, the transmission line is subjected to a sharp change of direction, from an horizontal direction along signal track 140s to a vertical direction to interconnecting ball 150s, even greater than the one associated with wire bonding (assuming that the wire is kept shorter than 1 mm). Particularly, a stray capacitor formed between contact area 145s and the underlying ground structure has a relative high capacitance of about 500 femtoFarads (fF), if compared to the stray capacitance formed between interconnecting balls 150s and 150cl and between the interconnecting balls 150s and 150ch, which is in the order of about 10 fF.

Figure 2B:
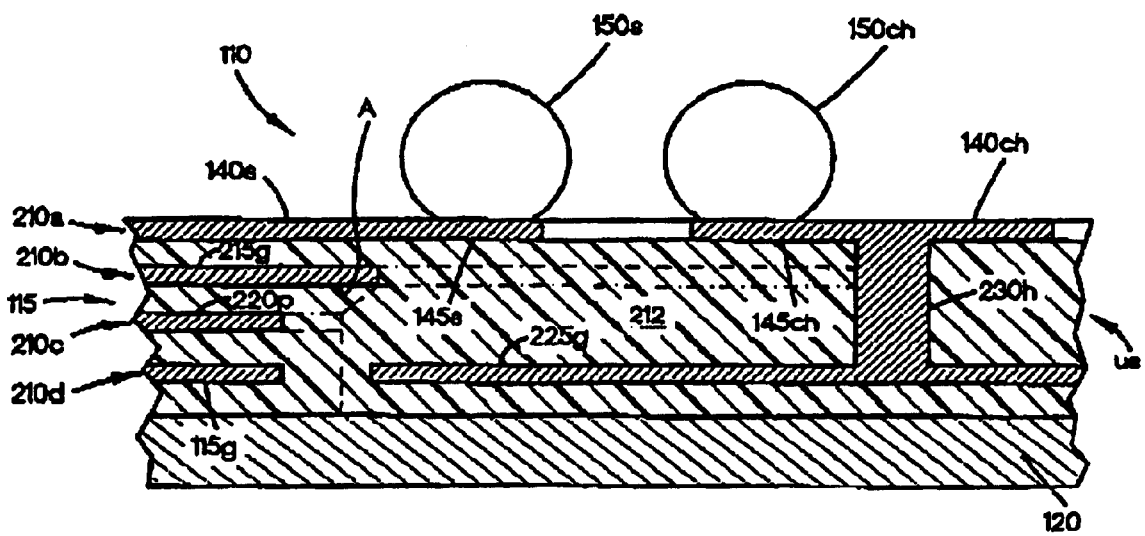

Considering now a cross-section along the line A—A of FIG. 1, as shown in FIG. 2b, substrate 115 comprises several conductive layers 210a, 210b, 210c and 210d. The conductive layers 210a–210d are insulated from each other and from stiffener 120, by means of a dielectric material 212.

The conductive signal track 140s and the co-planar tracks 140ch and 140cl are formed in conductive layer 210a which is defined as the first conductive layer starting from the upper surface of the chip carrier 110. A ground plane 215g is formed in conductive layer 210b adjacent to first conductive layer 210a and is defined as a second conductive reference track. Moreover, a power plane 220p is formed in conductive layer 210c (adjacent to the conductive layer 210b) and is defined as the second conductive layer. A further ground plane 225g and one or more further conductive signal tracks 225s (not shown) for transmitting high-frequency signals are formed in conductive layer 210d. Conductive layer 210d is defined as the first conductive reference track.

Substrate 115 includes at least via-hole 230h. The shape of via-hole 230h is a cylinder. The via-hole can also be the shape of a truncated cone or other shape suitable for making a connection from one conductive plane of substare 115 to another. The via-hole 230h includes a conductive material on its sidewall that electrically connects ground planes 215g (connection is shown in phantom) and 225g to co-planar track 140ch, and then to the reference voltage though interconnecting ball 150ch. The power plane 220p is connected (through a further via-hole, not shown in the figure) to a power supply voltage of about 1.2V.

The ground planes 215g and 225g and the co-planar tracks 140ch and 140cl define a reference structure which controls the impedance of the transmission line associated with conductive signal track 140s and shields the conductive signal track from electromagnetic interference.

A portion 145s of conductive signal track 140s, excluding an area corresponding to an area substantially equal to the orthographic projection of interconnecting ball 150s on conductive layer 210a, is superimposed in plan view onto ground plane 215g and the projection of its image creates a shadow onto ground plane 215g. The area 145s is superimposed in plan view onto ground plane 225g, without interposition of any other of conductive layers 210a–210c and the projection of its image creates a shadow onto ground plane 225g. In other words, ground plane 215g does not intersect a shadow of the projection of contact area 145s. Importantly, ground planes 215g and 225g define an open reference structure with a discontinuity in its uniformity corresponding to the discontinuity in the transmission line defined by the conductive signal track 140s and interconnecting ball 150s.

The power plane 220p and conductive signal track 225s (not shown) are arranged outside an umbra shadow of contact area 145s. The umbra shadow is defined by drawing a line from an end surface of conductive layer 210c (shown in phantom) to an end surface of ground plane 215g and forming an angle, A, of about 30°–60° (preferably about 45°) with end surface of ground plane 215g.

Likewise considerations apply if the chip carrier has a different structure, for example with two differential signal tracks arranged between the co-planar tracks, if the chip carrier includes a different number of conductive layers, if a further ground plane is provided on top of the first conductive layer wherein the signal tracks are formed, if the ground planes and the power plane consists of two or more distinct tracks, if the contact area has a different dimension, and so on. A differential signal track is defined as two conductors spaced closely in the same plane and forming a complete conducting loop path for a signal.

More generally, the present invention provides a chip carrier for a high-frequency electronic device including a circuitized substrate with a plurality of conductive layers insulated from each other. The conductive layers are arranged in a sequence from a first one of the conductive layers wherein a plurality of signal tracks are formed, each one terminating at a contact area for transmitting a high-frequency signal. The chip carrier includes a reference structure connectable to a reference voltage for shielding the signal tracks; the reference structure has at least one reference track formed in a second one of the conductive layers adjacent to the first conductive layer and at least one further reference track formed in one of the conductive layers different from the first and second conductive layer; a portion of each signal track excluding the contact area is superimposed in plan view to a corresponding reference track, and the contact area of each signal track is superimposed in plan view to a corresponding further reference track without interposition of any other of the conductive layers.

The invention substantially reduces the capacitance of the stray capacitor formed between conductive signal track 140s and ground plane 215g (being inversely proportional to the distance between them).

The invention maintains integrity of the electromagnetic wave propagated along the transmission line. Importantly, the proposed design of the chip carrier has minimal effects on the performance of the chip, so that the electronic package can operate at a frequency very close to the working frequency which is afforded by the chip.

Moreover, the solution according to the present invention maintains the bandwidth of the transmission line at a satisfactory value, even if the dimensions of the conductive signal track and/or the thickness of the dielectric layer between the conductive signal track and the adjacent ground plane(s) are reduced. The chip carrier of the present invention, makes it possible to produce high performance electronic packages with small dimensions.

Figure 3A:
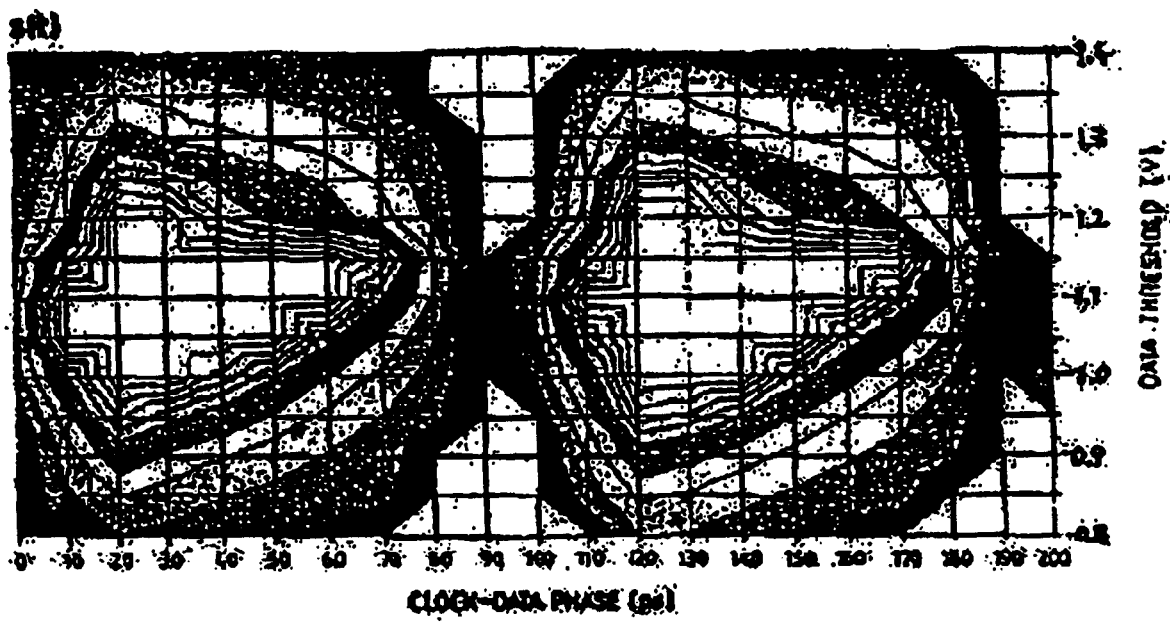
FIGS. 3a and 3b are eye-diagrams of a signal in a known electronic package and in the chip carrier and electronic package of the present invention, respectively.
Figure 3B:
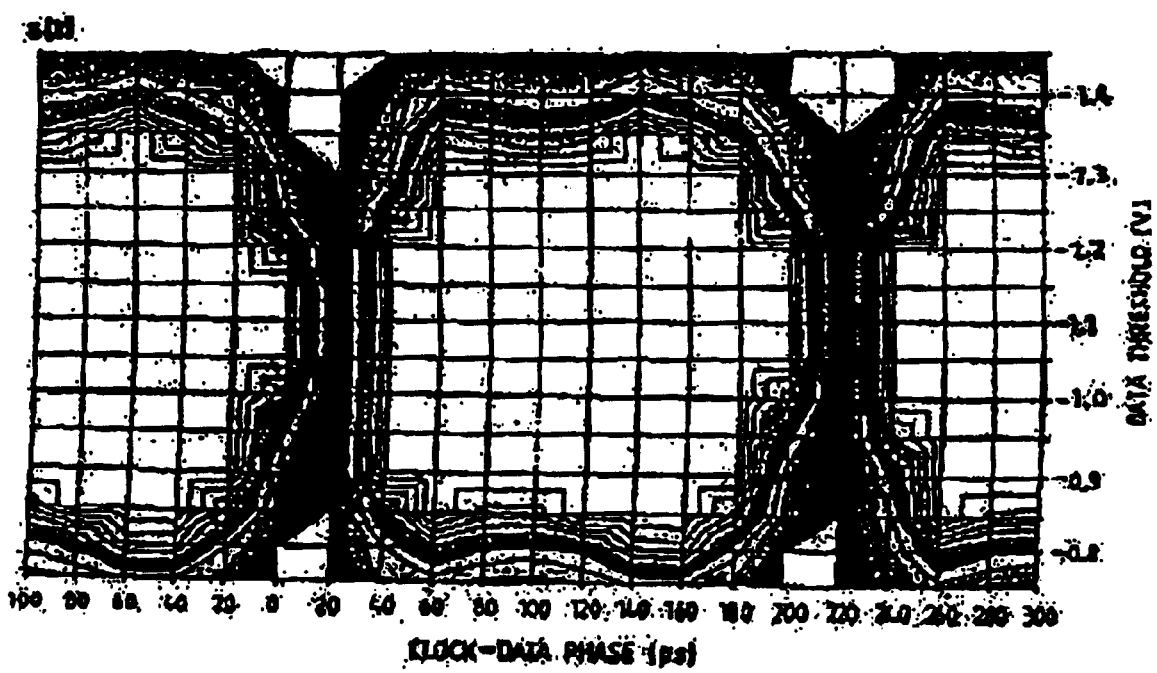

With reference in particular to FIG. 3a, there is shown an eye-diagram for a known electronic device, with only a single ground plane adjacent to a signal track. The single ground plane also lies under the respective contact area of an interconnecting ball. The eye-diagram shows the value (in V) of a signal s(t) received from a transmission line as a function of the phase of a clock signal. The central portion of the eye-diagram is substantially closed, due to the discontinuities in the transmission line. An eye-diagram for the electronic package embodying the chip carrier of the present invention is shown in FIG. 3b. The eye diagram is more open, so that it is easier to discriminate an actual switching transition of the signal from a shift of a signal baseline due to a background noise. As a consequence, the electronic package can be operated at a high-frequency even with a reduced level of power supply voltage.

Figure 4A:
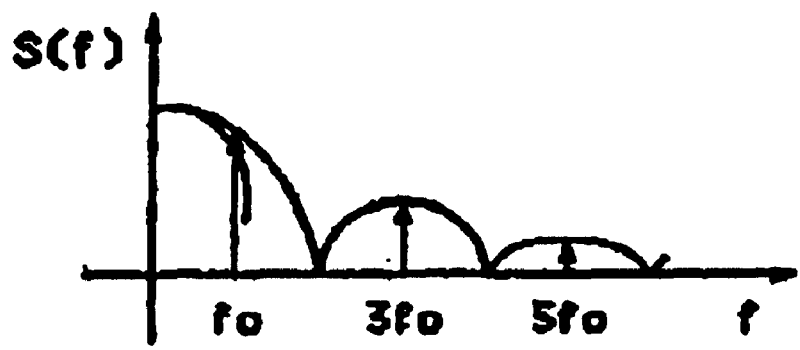
FIGS. 4a and 4b are graphical representations of the bandwidths of the signals of the eye-diagrams of FIGS. 3a and 3b, respectively, in the frequency domain.
Figure 4B:
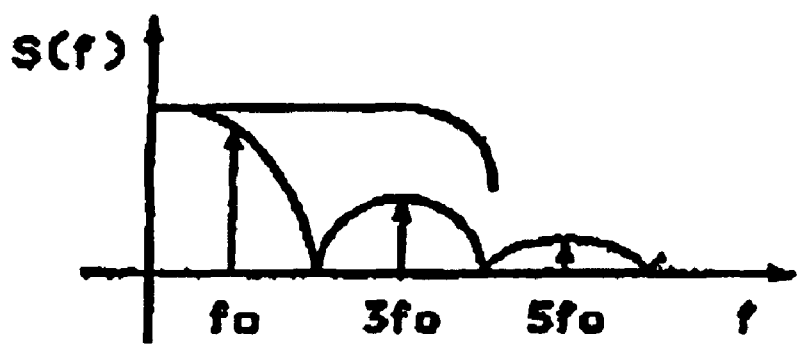

In other words, in the known electronic device the low-pass filter defined by the stray capacitor formed between the contact area and the underlying ground plane has a very low cut-off frequency. Therefore, as shown in FIG. 4a, only the first harmonic $f_0$ of the signal s(f) (expressed in the frequency domain) is transmitted. On the other hand, the chip carrier and electronic package of the present invention increases the bandwidth of the transmission line up to the third harmonic $3f_0$ of the signal, as shown in FIG. 4b.

The preferred embodiment of the present invention described above offers further advantages. Particularly, ground plane 225g formed in the last conductive layer 210 of the chip carrier allows the contact area and the underlying ground plane to be as far apart as possible, so that the capacitance of the corresponding stray capacitor is reduced to a minimum value (of the order of about 100 fF).

The values proposed for the acute angle defining the umbra shadow substantially assures that no interference is created within the reference structure for the conductive tracks formed in the intermediate layers and assures that a minimal chip carrier area is utilized for the reference structure. The conductive signal tracks (not shown) formed in last layer 210d outside the umbra shadow allow full exploitation of this layer without any interference with ground plane 115g formed therein.

The co-planar tracks improve the control of the impedance of the transmission line. Moreover, they increase the shielding of the corresponding conductive signal track from electromagnetic interference.

Each via-hole connects each co-planar track to a corresponding ground plane in a very simple manner. Moreover, the interconnecting balls associated with each co-planar track guarantee a very uniform distribution of the reference voltage across the entire structure.

The particular type of the electronic package wherein the chip is embedded within the cavity of the substrate, bonded to the stiffener, and wire bonded to the chip carrier, better exploits the high performance of the chip carrier of the present invention.

Moreover, the chip carrier of the present invention leads itself to be used even in an electronic package of a different type, for example, a flip chip package without a chip cavity, and so on.

In order to satisfy local and specific requirements, a person skilled in the art may apply to the solution described above many modifications and alterations all of which, however, are included within the scope of protection of the present invention as defined by the following claims.

What is claimed is:

1. A chip carrier comprising:
   a first conductive layer having at least one signal track and at least one contact area, said contact area being electrically connected to said signal track and adapted for transmitting a high-frequency signal; and
   a reference structure including a first conductive reference track insulated and spaced from said first conductive layer, said first conductive reference track having a first portion and a second portion spacedly positioned from said first portion, and a second conductive reference track insulated from said first conductive layer and said first conductive reference track, a portion of said second conductive reference track spaced between said first conductive layer and said first conductive reference track, said signal track substantially overlying said portion of said second conductive reference track, and said contact area substantially overlying said first portion of said first conductive reference track, said signal track being electrically shielded by said reference structure.

2. The chip carrier according to claim 1, wherein said at least one contact area includes a solder bump positioned thereon.

3. The chip carrier according to claim 1, wherein said at least one contact area shadows only said first portion of said first conductive reference track.

4. The chip carrier according to claim 1, wherein said first conductive reference track comprises a ground plane.

5. The chip carrier according to claim 1, wherein said second conductive reference track comprises a ground plane.

6. The chip carrier according to claim 1, further including a second conductive layer positioned between said portion of said second conductive reference track and said second portion of said first conductive reference track, said portion of said second conductive reference track including an end surface and said second conductive layer including an end surface, wherein a line drawn between said end surfaces forms an acute angle with said portion of said second conductive reference track.

7. The chip carrier according to claim 6, wherein said second conductive layer comprises a power plane.

8. The chip carrier according to claim 6, wherein said acute angle is about 30° to about 60°.

9. The chip carrier according to claim 8, wherein said acute angle is about 45°.

10. The chip carrier according to claim 6, wherein said portion of said second conductive reference track substantially shadows said second portion of said first conductive reference track and said second conductive layer.

11. The chip carrier according to claim 1, wherein said first conductive layer further includes at least two substantially co-planar electrically conductive tracks, said signal track being positioned between said at least two substantially co-planar electrically conductive tracks, said first conductive layer further including two contact areas other than said at least one contact area, each of said two contact areas electrically coupled to a respective one of said substantially co-planar electrically conductive tracks.

12. The chip carrier according to claim 11, further including a conductive via, said conductive via electrically connecting one of said at least two co-planar tracks to said first portion of said first conductive reference track and to said portion of said second conductive reference track.

13. An electronic package comprising:

a chip carrier including a first conductive layer having at least one signal track and at least one contact area, said contact area being electrically connected to said signal track and adapted for transmitting a high-frequency signal, said chip carrier further including a reference structure including a first conductive reference track insulated and spaced from said first conductive layer, said first conductive reference track having a first portion and a second portion spacedly positioned from said first portion, and a second conductive reference track insulated from said first conductive layer and said first conductive reference track, a portion of said second conductive reference track spaced between said first conductive layer and said first conductive reference track, said signal track substantially overlying said portion of said second conductive reference track, and said contact area substantially overlying said first portion of said first conductive reference track, said signal track being electrically shielded by said reference structure; and a semiconductor chip positioned on said chip carrier and having at least one terminal electrically interconnected to said at least one contact area.

14. The chip carrier according to claim 13, wherein said at least one contact area shadows only said first portion of said first conductive reference track.

15. The electronic package of claim 13, further including at least one wire bond, said wire bond electrically coupling said at least one terminal to said at least one contact area.

16. The electronic package of claim 13, wherein said chip carrier further includes a heat sink having a first surface and at least one sidewall therein, said first surface of said heat sink and said side wall defining a cavity within said chip carrier, said semiconductor chip positioned on said surface of said heatsink in said cavity.

17. The electronic package according to claim 13, further including a second conductive layer positioned between said portion of said second conductive reference track and said second portion of said first conductive reference track, said portion of said second conductive reference track including an end surface and said second conductive layer including an end surface, wherein a line drawn between said end surfaces forms an acute angle with said portion of said second conductive reference track.

18. The electronic package according to claim 17, wherein said acute angle is about 30° to about 60°.

19. The electronic package according to claim 18, wherein said acute angle is about 45°.

20. The electronic package according to claim 17, wherein said portion of said second conductive reference track substantially shadows said second portion of said first conductive reference track and said second conductive layer.

* * * * *